(12) United States Patent
Sato

(10) Patent No.: US 7,805,650 B2
(45) Date of Patent: Sep. 28, 2010

(54) SEMICONDUCTOR INTEGRATED CIRCUIT AND DEBUG MODE DETERMINATION METHOD

(75) Inventor: Takashi Sato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 225 days.

(21) Appl. No.: 12/232,178

(22) Filed: Sep. 11, 2008

(65) Prior Publication Data

US 2009/0106609 A1    Apr. 23, 2009

(30) Foreign Application Priority Data

Oct. 18, 2007    (JP) .............................. 2007-271657

(51) Int. Cl.
*G01R 31/28*    (2006.01)

(52) U.S. Cl. ......................... 714/733; 714/39

(58) Field of Classification Search .................... 714/31, 714/38, 733, 39; 712/227; 716/4
See application file for complete search history.

(56) References Cited

U.S. PATENT DOCUMENTS

| 4,670,838 | A | | 6/1987 | Kawata | |
|---|---|---|---|---|---|
| 5,053,949 | A | * | 10/1991 | Allison et al. | 714/31 |
| 6,321,329 | B1 | * | 11/2001 | Jaggar et al. | 712/227 |
| 6,591,378 | B1 | * | 7/2003 | Arends et al. | 714/38 |
| 7,055,117 | B2 | * | 5/2006 | Yee | 716/4 |

FOREIGN PATENT DOCUMENTS

JP    59-146352    8/1984

* cited by examiner

*Primary Examiner*—David Ton
(74) *Attorney, Agent, or Firm*—Staas & Halsey LLP

(57) ABSTRACT

A semiconductor integrated circuit has a terminal to input a debug signal which specifies a debug mode, a reset circuit to generate a reset signal when a power is turned ON, and a debug mode control circuit to output a control signal which causes a shift to the debug mode based on the debug signal and the reset signal. The debug mode control circuit includes a latch circuit to generate a first signal by latching the debug signal, and a register circuit to generate a second signal when written with a permit code, and the control signal is generated based on the first signal and the second signal.

13 Claims, 14 Drawing Sheets

SEMICONDUCTOR INTEGRATED CIRCUIT AND DEBUG MODE DETERMINATION METHOD

BACKGROUND

1. Field

The present invention generally relates to semiconductor integrated circuits and debug mode determination methods, and more particularly to a semiconductor integrated circuit which is configured to determine a debug mode of a microcontroller using power-ON reset and to a debug mode determination method.

2. Description of the Related Art

In an apparatus including an information processing unit such as a Central Processing Unit (CPU), typified by a microcontroller such as a Micro Control Unit (MCU), a debug system is generally used when developing a program which is to be operated by the CPU. The debug system supports the debugging by displaying various operation information of the program that is being developed, and providing specific operating functions with respect to the program that is being developed.

FIG. 1 is a block diagram showing an example of a structure of a debug system for a single-chip MCU. In FIG. 1, a MCU 1, which is a semiconductor integrated circuit, is connected to a host computer 3 via an external debug unit 2.

The MCU 1 includes a CPU 11, a debug circuit 12, a storage device 13, peripheral function parts (or blocks) 14 and 15, a power-ON reset circuit 16, a reset control circuit 17, and debug terminals (or mode terminals) 18 which are connected as shown in FIG. 1. The CPU 11, the storage device 13, and the peripheral function parts 14 and 15 are connected via a bus 19. The debug system is formed by at least the debug circuit 12 within the MCU 1 which is a debug target, the external debug unit 2, and the host computer 3.

The debug circuit 12 monitors and controls various operations and states of the CPU 11. The debug circuit 12 is connected to the external debug unit 2 which carries out various debug processes outside the MCU 1, via the debug terminals 18 and a dedicated (or exclusive) signal interface 41. The external debug unit 2 is connected, via a dedicated (or exclusive) signal interface 42, to the host computer 3 which executes a debugger software 31.

The debug terminals 18 for connecting the debug circuit 12 and the external debug unit 2 are subject to restrictions, and the debug terminals 18 cannot be used at times other than the time of the debugging or, the debugging of the debug terminals 18 cannot be made even if the debug terminals 18 are used at times other than the time of the debugging. For this reason, there is a demand to minimize the number of debug terminals 18. Particularly in a debug system which enables the debugging of a mass-produced MCU by providing a debug circuit in the mass-produced MCU, it is desirable that only a single debug terminal is provided.

When the number of debug terminals 18 is one, it is necessary to multiplex into one signal the necessary functions, such as a communication function between the external debug unit 2 and the debug circuit 12 and a debug mode control function of the debug circuit 12, which were realized by a plurality of debug terminals 18. A description will hereunder be given for a case where the communication function between the external debug unit 2 and the debug circuit 12 and the debug mode control function of the debug circuit 12, which are the minimum necessary functions necessary to realize the debug function, are multiplexed.

The communication function between the external debug unit 2 and the debug circuit 12 can be realized by making the debug terminal 18 function as a bidirectional terminal for half-duplex serial communication.

The debug mode control function of the debug circuit 12 determines a mode (debug valid mode) which permits the debugging of the MCU 1 and a mode (debug invalid mode) which prohibits the debugging of the MCU 1. The power-ON reset circuit 16 within the MCU 1 outputs a reset signal (hereinafter referred to as a power-ON reset signal) Por when the power-ON reset circuit 16 detects that the power is turned ON and/or a power supply voltage has decreased below a tolerable value (hereinafter referred to as a time when the power supply voltage decreased is detected). Hence, an input signal level at the debug terminal 18 is latched during a time when the power-ON reset signal Por is generated, and a mode selected by the latched signal level is judged. After the mode is determined, a user program is executed after the resetting of the MCU 1 is cancelled in the case of the debug invalid mode, and a debug program (or monitor program) dedicated to (or exclusively for) the debugging is executed after the resetting of the MCU 1 is cancelled in the case of the debug valid mode.

The use of the debug terminal 18 for the debug mode control is limited to the timings when the power is turned ON and the power supply voltage decrease is detected. At these timings, the MCU 1 is initialized, and for this reason, no communication is made between the external debug unit 2 and the debug circuit 12. Hence, the communication function between the external debug unit 2 and the debug circuit 12 and the debug mode control function of the debug circuit 12 do not interfere with each other.

FIG. 2 is a flow chart for explaining a process of the debug mode control. In FIG. 2, the power of the MCU 1 is turned ON in a step S1, and a step S2 decides whether or not a power-ON reset by the power-ON reset signal Por is generated. If the decision result in the step S2 is NO, a step S3 judges that the debug mode is indefinite, and the process ends.

If the decision result in the step S2 is YES, a step S4 decides whether or not the external debug unit 2 is connected to the MCU 1. If the decision result in the step S4 is NO, a step S5 sets an input signal to the debug terminal 18 to a high level when cancelling the power-ON reset, and a step S6 determines the mode to the debug invalid mode. The resetting of the MCU 1 is cancelled in a step S7, the CPU 11 executes the user program in a step S8, and the process ends.

If the decision result in the step S4 is YES, a step S9 sets the input signal to the debug terminal 18 to a low level when cancelling the power-ON reset, and a step S10 determines the mode to the debug valid mode. The resetting of the MCU 1 is cancelled in a step S11, and the CPU 11 executes the monitor program for realizing the debug function in a step S12. In addition, a step S13 makes a communication with the external debug unit 2 via the debug terminal 18, and the process ends.

FIG. 3 is a circuit diagram showing an example of a conventional debug circuit. In addition, FIGS. 4 through 6 respectively are time charts showing timings of the debug mode control for a case where a debug circuit 12A shown in FIG. 3 is used as the debug circuit 12 shown in FIG. 1. FIG. 4 is a time chart for explaining a case where the debug invalid mode is specified, FIG. 5 is a time chart for explaining a case where the debug valid mode is specified, and FIG. 6 is a time chart for explaining a case where the power-ON reset is not generated in a normal manner. In FIGS. 4 through 6, VCC denotes the power supply voltage of the MCU 1, Por denotes the power-ON reset signal output from the power-ON reset circuit 16, Pdt denotes a debug signal which is input to the debug terminal 18 and specifies the debug mode of the MCU 1, and Pdm denotes a debug mode signal which is output from the debug circuit 12 and shifts the mode of the MCU 1 to the debug mode. In FIGS. 4 through 6, the ordinate indicates the signal level in arbitrary units, and the abscissa indicates the time in arbitrary units.

The debug circuit 12A shown in FIG. 3 includes a communication function block 211, and a debug mode control circuit 212 which has a data latch circuit 213. The data latch circuit 213 is formed by a delay latch (D-latch). The communication function block 211 realizes the above described communication function between the external debug unit 2 and the debug circuit 12A, and a communication function block having a known structure may be used for this communication function block 211. The debug terminal 18 is connected to the power supply voltage VCC via pull-up resistor 19. The debug signal Pdt which is input to the debug terminal 18 during an active time of the power-ON reset signal Por is latched by the data latch circuit 213, and the latched value is output as the debug mode signal Pdm. In this example, the debug mode signal Pdm assumes a low level as shown in FIG. 4 and indicates the debug invalid mode when the input signal level at the debug terminal 18 is high at the time of the power-ON reset, and the debug mode signal Pdm assumes a high level as shown in FIG. 5 and indicates the debug valid mode when the input signal level at the debug terminal 18 is low at the time of the power-ON reset. Accordingly, when the external debug unit 2 is not connected to the MCU 1, the input signal level at the debug terminal 18 becomes high at the time of the power-ON reset, and the debug mode signal Pdm always assumes a low level to indicate the debug invalid mode. When the external debug unit 2 is connected to the MCU 1, the external debug unit 2 monitors the power supply of the MCU 1, and inputs a low-level signal to the debug terminal 18 of the MCU 1 for a predetermined time from a time when the power is turned ON (that is, from a time when the power-ON reset is generated). Consequently, in the debug circuit 12A, the debug mode signal Pdm assumes a high level to indicate the debug valid mode.

Therefore, the power-ON reset signal Por, which is output from the power-ON reset circuit 16 when the power is turned ON and the power supply voltage decrease is detected, is used when determining the debug mode. However, as shown in FIG. 6, this power-ON reset signal Por may not be generated in a case where the power supply voltage VCC rises very slowly or gradually. In such a case, the latch gate of the data latch circuit 213 shown in FIG. 3 which receives the power-ON reset signal Por will not become active, and the debug mode signal Pdm output from the data latch circuit 213 will become indefinite. As a result, there is a possibility that the MCU 1 will be started in the debug mode that is not intended.

The reset control circuit 17 outputs a reset signal Rst which resets the MCU 1 based on the power-ON reset signal Por.

Among other things, a Japanese Laid-Open Patent Application No. 59-146352 proposes a single-chip microcontroller having a normal mode and a debug mode.

Conventionally, if the external debug unit is not connected to the MCU which is provided in an apparatus, for example, the debug invalid mode is anticipated for the debug mode when no power-ON reset is generated, but there is a possibility that the debug valid mode will occur. On the other hand, when the external debug unit is connected to the MCU, the debug valid mode is anticipated for the debug mode, but there is a possibility that the debug invalid mode will occur.

When the MCU is provided in an apparatus, such as a product, and is operated, the MCU must operate in the debug invalid mode. However, according to the conventional debug mode control, there is a possibility that the debug valid mode will occur if the power-ON reset is not generated when the power is turned ON. If the MCU provided in the apparatus assumes the debug valid mode which is not intended, the MCU operates in the mode which is not intended by the apparatus and may cause considerable effects on the operation of the apparatus. As a countermeasure, it is conceivable to resume the mode from the debug valid mode which is not intended, but this would require detection of a mode abnormal state of the MCU and turning ON the power of the MCU again. However, the structure of the apparatus would become complex and the cost of the apparatus would increase if a mechanism for realizing such a countermeasure were to be implemented in the apparatus. For this reason, it is essential to avoid the mode becoming the debug valid mode in the case where the debug invalid mode is specified.

Therefore, when no power-ON reset is generated, it was conventionally difficult to appropriately determine the debug mode.

SUMMARY

According to one aspect of the present invention, there is provided a semiconductor integrated circuit includes a terminal configured to input a debug signal which specifies a debug mode; a reset circuit configured to generate a reset signal when a power is turned ON; and a debug mode control circuit configured to output a control signal which causes a shift to the debug mode based on the debug signal and the reset signal, said debug mode control circuit comprising a latch circuit configured to generate a first signal by latching the debug signal; and a register circuit configured to generate a second signal when written with a permit code, wherein the control signal is generated based on the first signal and the second signal.

According to another aspect of the present invention, there is provided a debug mode determination method includes a mode of a first stage determined by an input signal level of a mode terminal when a power-ON reset is generated; and a mode of a second stage determined by writing a code which permits a debug mode into an accessible mode register when the mode of the first stage is a specific mode, wherein the debug mode is controlled by the mode of the first stage and the mode of the second stage.

Other objects and further features of the present invention will be apparent from the following detailed description when read in conjunction with the accompanying drawings.

DESCRIPTION OF THE PREFERRED EMBODIMENTS

The embodiments may be applied to circuits which carry out a mode control, such as a debug circuit which supports debugging of an information processing unit provided within a microcontroller or the like. The debug circuit, provided within a semiconductor integrated circuit forming the microcontroller, has a function of controlling a debug valid mode and a debug invalid mode. In a debug mode control which determines the mode by detecting an input signal level at a debug terminal of the microcontroller at the time of a power-ON reset, the debug invalid mode is specified, and the mode is determined to the debug invalid mode if no power-ON reset is generated.

Accordingly, it is possible to appropriately determine the debug mode even if no power-ON reset is generated.

A description will be given of embodiments of the semiconductor integrated circuit and debug mode determination method according to the present invention, by referring to FIG. 7 and the subsequent figures.

Figure 1:
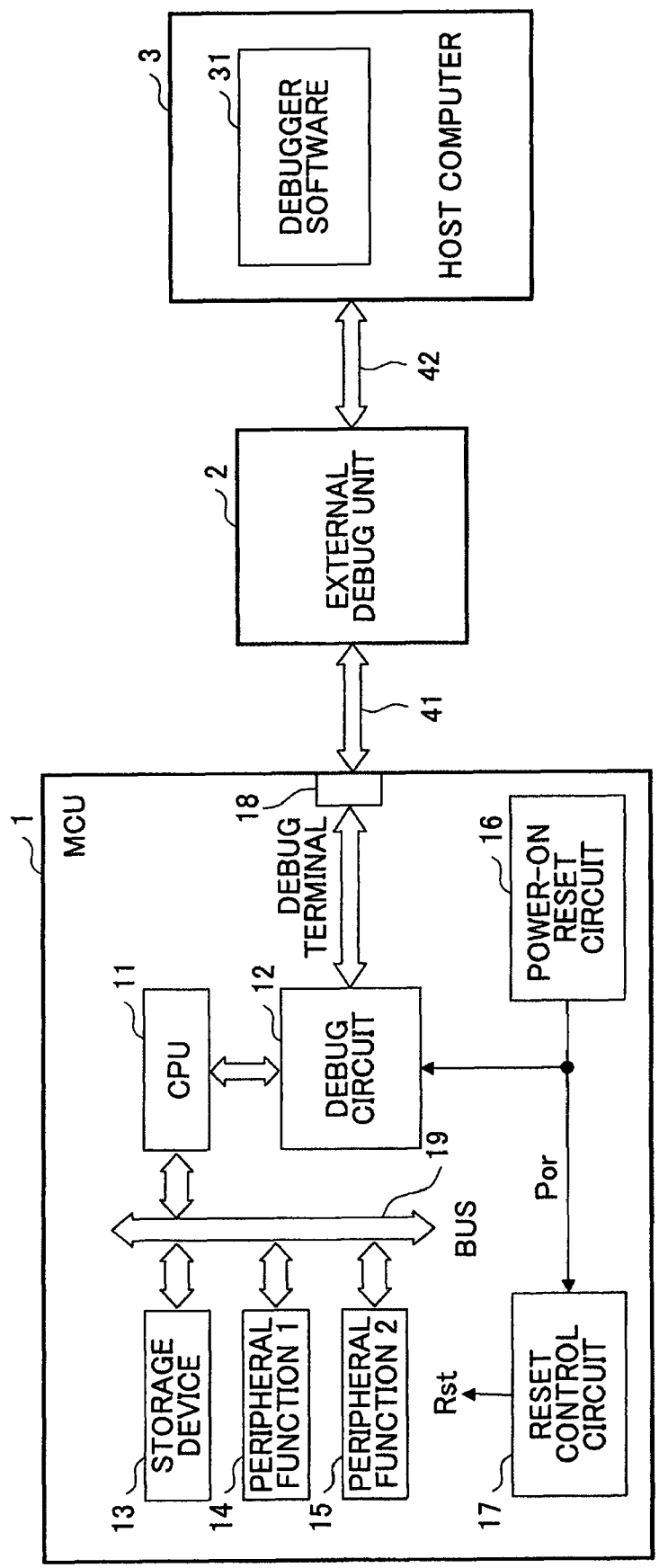
FIG. 1 is a block diagram showing an example of a structure of a debug system for a single-chip MCU.
Figure 2:
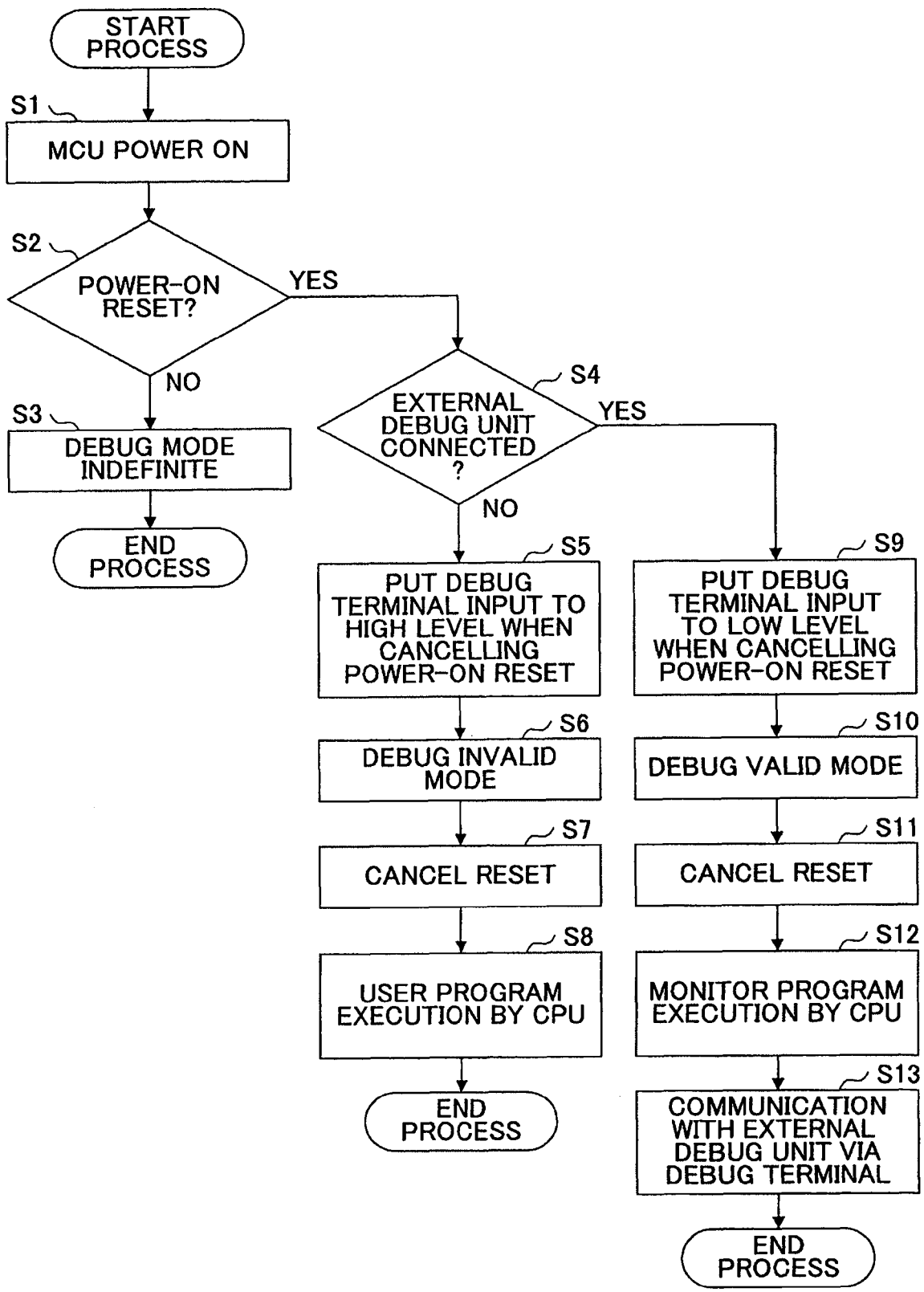
FIG. 2 is a flow chart for explaining a process of a debug mode control.

In an apparatus including an information processing unit such as a CPU, typified by a microcontroller such as a MCU, a debug system is used when developing a program which is to operate the CPU. In each of the embodiments of the present invention described hereunder, it is assumed for the sake of convenience that the basic structure of the debug system for the single-chip MCU is the same as that shown in FIG. 1. In other words, it is assumed that a MCU 1, which is a semiconductor integrated circuit, is connected to a host computer 3 via an external debug unit 2, as shown in FIG. 1.

Figure 3:
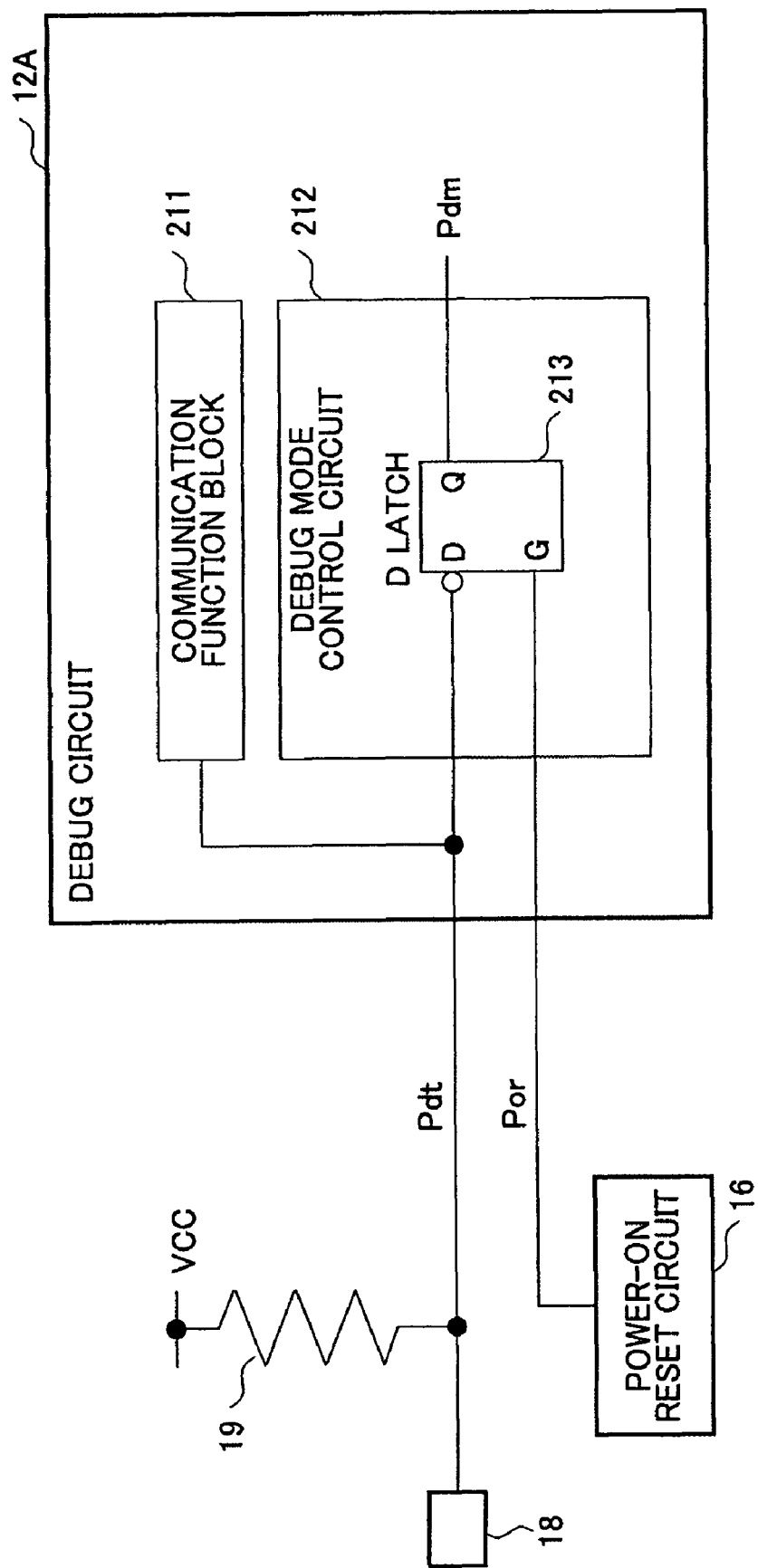
FIG. 3 is a circuit diagram showing an example of a conventional debug circuit.

Conventionally, the signal level at the debug terminal 18 at the time of the power-ON reset is latched using the data latch circuit 213 shown in FIG. 3, in order to generate the debug mode signal Pdm. However, in a situation where no power-ON reset is generated, there is a possibility that the debug valid mode will occur when the debug invalid mode is specified. Hence, a mechanism is required to set the debug mode signal Pdm to a low level (indicating the debug invalid mode) if the debug signal Pdt which specifies the debug invalid mode and is input to the debug terminal 18 has a low level, without being dependent upon the existence of the power-ON reset.

Figure 7:
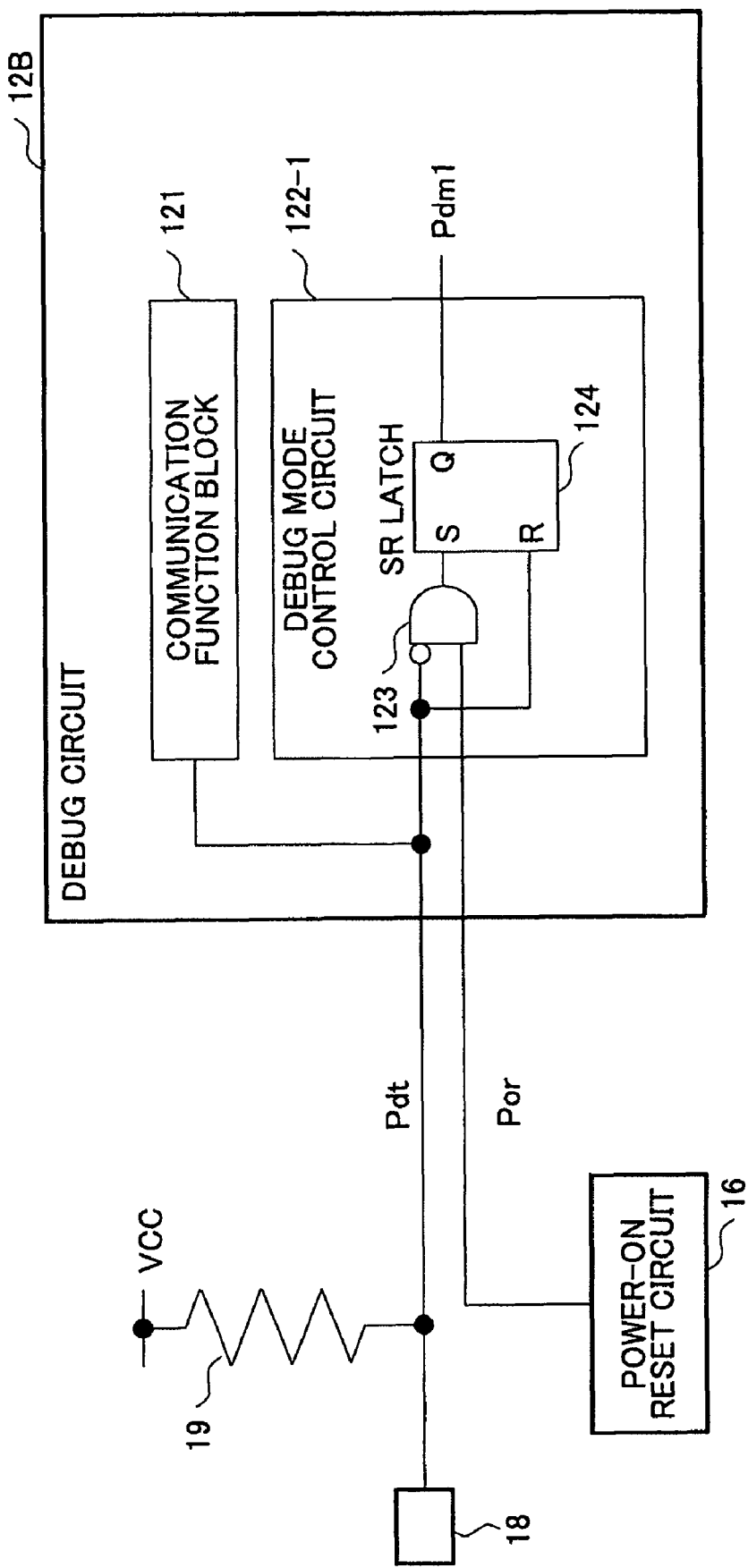
FIG. 7 is a circuit diagram showing a debug circuit in an embodiment of the present invention.

FIG. 7 is a circuit diagram showing a debug circuit in an embodiment of the present invention. In FIG. 7, those parts that are essentially the same as those corresponding parts in FIGS. 1 and 3 are designated by the same reference numerals, and a description thereof will be omitted.

A debug circuit 12B shown in FIG. 7 includes a communication function block 121, and a debug mode control circuit 122-1 having an AND circuit 123 and a data latch circuit 124. The data latch circuit 124 is formed by a set-and-reset latch (SR latch). The communication function block 121 realizes the above described communication function between the external debug unit 2 and the debug circuit 12B, and a communication function block having a known structure may be used for this communication function block 121. The debug terminal 18 is connected to the power supply voltage VCC via the pull-up resistor 19.

The debug signal Pdt input to the debug terminal 18 is input via the AND circuit 123 to a set terminal S of the SR latch forming the data latch circuit 124, and is input directly to a reset terminal R of the SR latch forming the data latch circuit 124. The power-ON reset signal Por is also input to the AND circuit 123. The value latched by the data latch circuit 124 is output as a debug mode signal Pdm1. The SR latch is configured to output a high-level signal from an output terminal Q in response to a set signal which is input to the set terminal S, and to output a low-level signal from the output terminal Q in response to a reset signal which is input to the reset terminal R.

In the debug circuit 12B shown in FIG. 7, the SR latch is set when the power-ON reset is generated and the low-level signal is input to the debug terminal 18. Hence, the output signal of the SR latch, namely, the debug mode signal Pdm1, assumes a high level (indicating the debug valid mode). On the other hand, when the high-level signal is input to the debug terminal 18, the resetting of the SR latch becomes active. As a result, the output signal of the SR latch, namely, the debug mode signal Pdm1, assumes a low level (indicating the debug invalid mode). Accordingly, the debug mode signal Pdm1 assumes the low level (indicating the debug invalid mode) when the input signal to the debug terminal 18 specifying the debug invalid mode has the high level, without being dependent upon the existence of the power-ON reset. For this reason, in a situation where no power-ON reset is generated, it is possible to solve the problem of the debug circuit 12A shown in FIG. 3 wherein the debug valid mode occurs when the debug invalid mode is specified.

When the debug mode is the debug valid mode, the debug terminal 18 is not only used for controlling the debug mode of the debug circuit 12B, but is also used for the communication between the external debug unit 2 and the debug circuit 12B. After the debug mode is determined to the debug valid mode, the external debug unit 2 communicates with the debug circuit 12B, but the debug signal Pdt input to the debug terminal 18 by this communication may either have a low level or a high level. Hence, according to the structure shown in FIG. 7, the resetting of the SR latch becomes active when the debug signal Pdt input to the debug terminal 18 assumes the low level, and the debug mode signal Pdm1 assumes a low level (indicating the debug invalid mode), thereby resulting in a possibility that it may not be possible to continue the debug mode.

Figure 8:
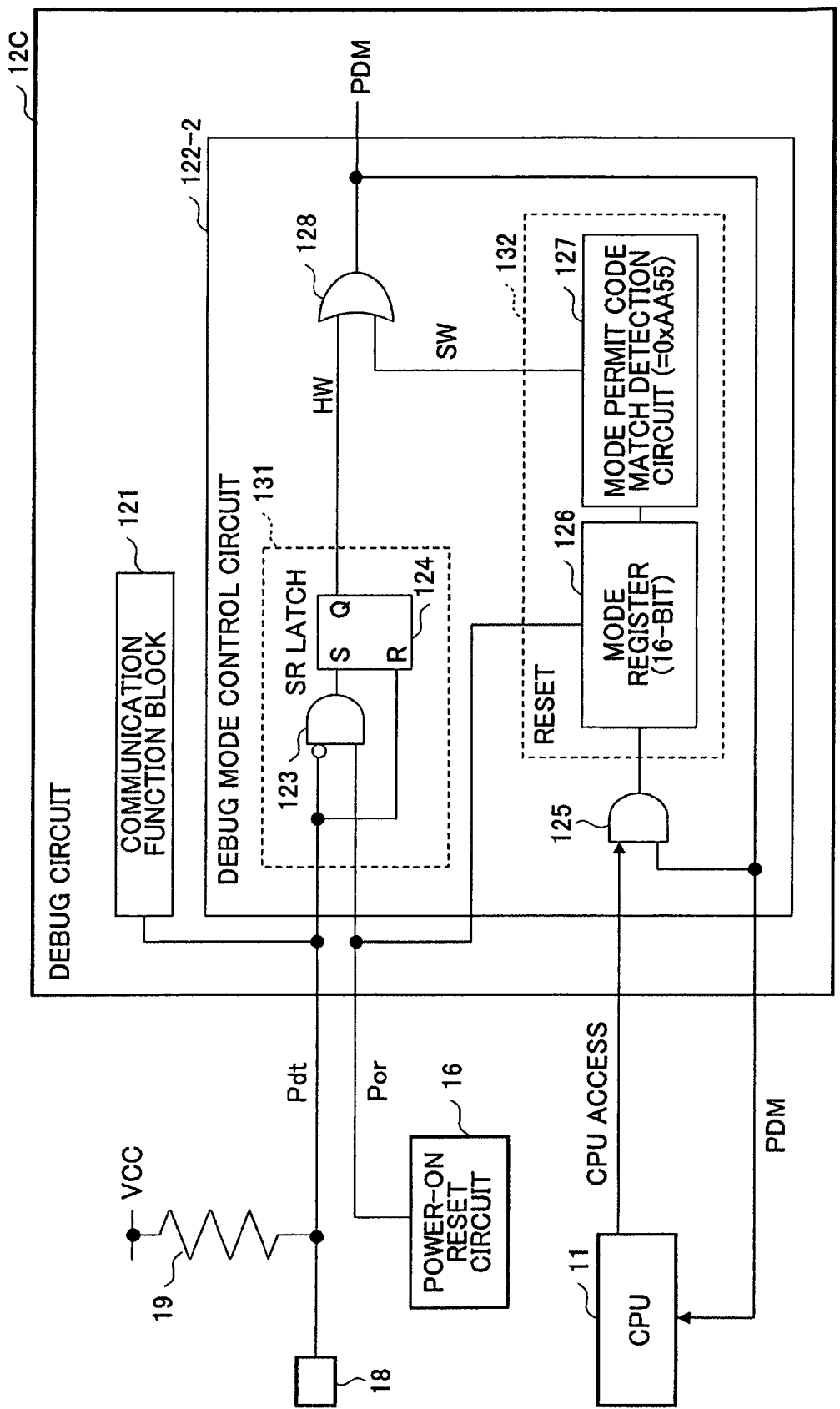
FIG. 8 is a circuit diagram showing a debug circuit in another embodiment of the present invention.

Next, a description will be given of another embodiment of the present invention which can also solve the inconvenience that may be encountered in the structure shown in FIG. 7, namely, that it may not be possible to continue the debug mode. FIG. 8 is a circuit diagram showing a debug circuit in another embodiment of the present invention. In FIG. 8, those parts that are essentially the same as those corresponding parts in FIGS. 1, 3 and 7 are designated by the same reference numerals, and a description thereof will be omitted.

A debug mode control circuit 122-2 within a debug circuit 12C includes an AND circuit 125, an OR circuit 128 and circuit parts 131 and 132 which are connected as shown in FIG. 8. The circuit part 131 has an AND circuit 123 and a data latch circuit 124 formed by an SR latch, which are connected as shown in FIG. 8. The circuit part 132 has a mode register 126 and a mode enable code match detection circuit 127 which are connected as shown in FIG. 8. The mode register 126 is only accessible in the debug valid mode, and the access from the CPU 11 to the mode register 126 is made via the AND circuit 125. The OR circuit 128 obtains a logical sum of an output of the circuit part 131 and an output of the mode enable code match detection circuit 127, and outputs the logical sum as a debug mode signal PDM. This debug mode signal PDM is supplied to the CPU 11 and to one input terminal of the AND circuit 125.

The debug valid mode that is determined by the debug mode control circuit 122-2 shown in FIG. 8, is determined from the signal levels of the power-ON reset signal Por and the debug signal Pdt which is input to the debug terminal 18, which are hardware factors. Accordingly, in the following description, a mode of this first stage will be referred to as a hardware mode.

For example, the mode register 126 is formed by a multi-bit register, such as a 16-bit register. This mode register 126 is accessible from the CPU 11 only when the debug mode signal PDM indicates the debug valid mode. Furthermore, all bits of this mode register 126 are initialized to a low level in response to the power-ON reset signal Por.

The mode enable code match detection circuit 127 detects whether or not the value of the mode register 126 matches a specific code which permits (or enables) the debug valid mode. The debug valid mode is determined by writing into the mode register 126 the specific code which permits the debug valid mode. Accordingly, in the following description, a mode of this second stage will be referred to as a software mode.

The value of the mode register 126 becomes indefinite when no power-ON reset is generated. In this state, in order not to put the software mode to the debug valid mode, the value of the mode register 126 must not match the specific code which permits the debug valid mode. One method of doing so is to form the mode register 126 by a large number of bits as much as possible, to reduce the possibility of the value of the mode register 126 matching the specific code. Another method of doing so is to utilize a characteristic of an initial value of an output of a flip-flop (hereinafter simply referred to as a flip-flop initial value) for a case where the flip-flop is not reset after the power is turned ON.

When the latter method is considered wherein the flip-flop initial value for the case where the flip-flop is not reset after the power is turned ON, the flip-flop initial value greatly depends upon the power ON conditions (or the manner in which the power supply starts). If a plurality of flip-flops are considered, it is known that the initial values of the flip-flops which are not reset are statistically distributed almost all at the high level or the low level, and it is very unlikely that the high levels and the low levels will coexist in the distribution. Hence, by utilizing this characteristic of the initial values of the flip-flops which are not reset, it is extremely effective to select the specific code which permits the debug valid mode to a code in which the high levels and the low levels respectively are 50%, because such a distribution in which 50% of the initial values are high levels and 50% are low levels is most unlikely to occur statistically for the initial values of the flip-flops which are not reset. For example, codes such as 0xAAAA, 0x5555, 0xA5A5 and 0x5A5A may be candidates for the specific code. It is assumed for the sake of convenience in the following description that the specific code is 0xAA55.

By forming the mode register 126 by the 16-bit register and selecting the specific code which permits the debug valid code to the code in which the high levels and the low levels respectively are 50% as a countermeasure against the case where the mode register 126 is not initialized, it is possible to prevent the indefinite initial value of the mode register 126 from matching the specific code which permits the debug valid mode, with an extremely high probability. For this reason, the probability of the indefinite initial value of the mode register 126 matching the specific code which permits the debug valid mode is negligibly low. Therefore, even in a case where the mode register 126 is not initialized because no power-ON reset is generated, it may essentially be regarded that the value of the mode register 126 will not match the specific code which permits the debug valid mode and that the software mode will not be put to the debug valid mode.

Next, a description will be given of the debug mode control in FIG. 8. The following four cases may occur depending on a combination of the specifying of the debug valid mode or the debug invalid mode and the case where the power-ON reset is generated in a normal manner or the case where the power-ON reset is not generated in a normal manner.

Case (1): A case where the debug invalid mode is specified, and the power-ON reset is generated in a normal manner.

Case (2): A case where the debug valid mode is specified, and the power-ON reset is generated in a normal manner.

Case (3): A case where the debug invalid mode is specified, and the power-ON reset is not generated in a normal manner.

Case (4): A case where the debug valid mode is specified, and the power-ON reset is not generated in a normal manner.

Figure 9:
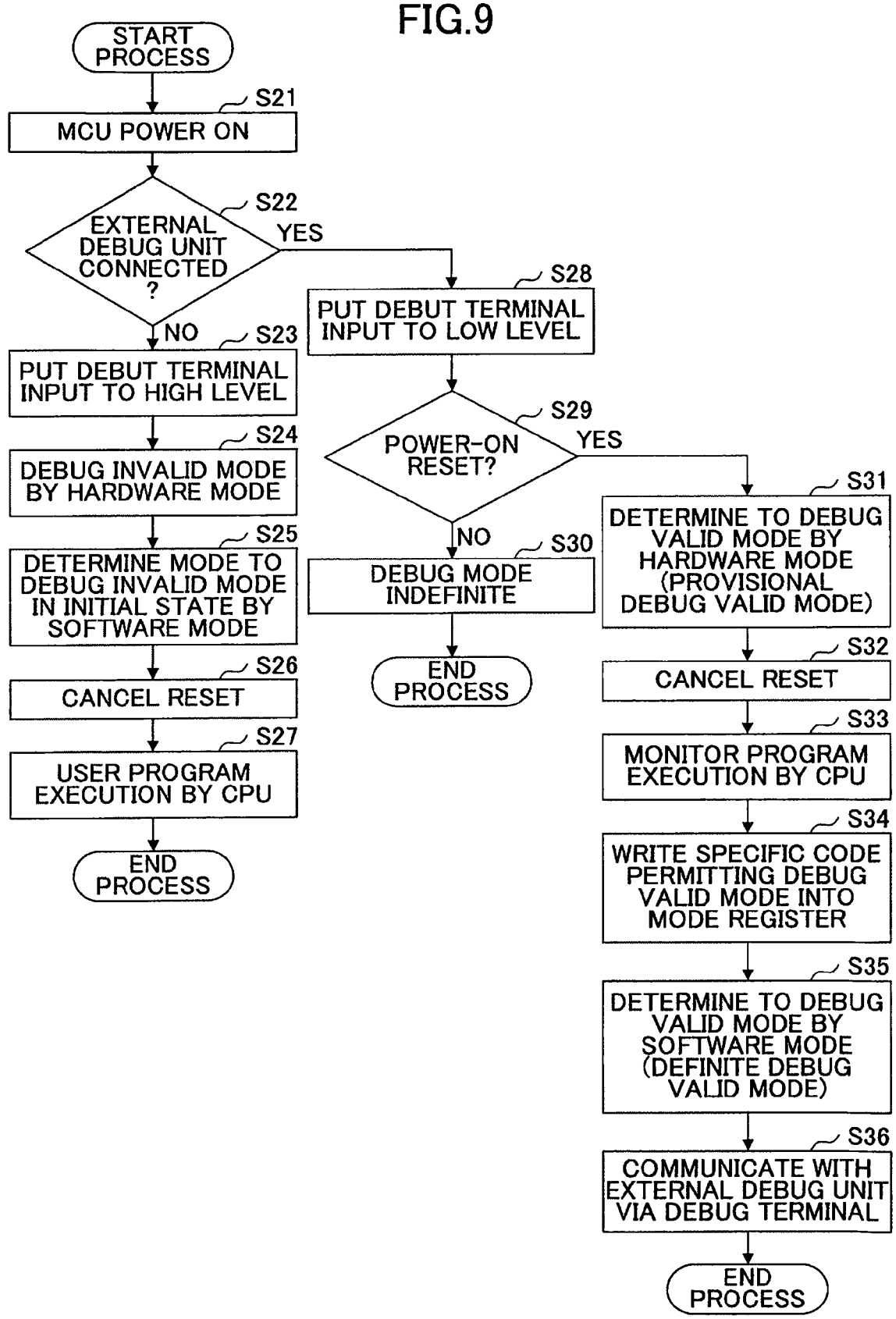
FIG. 9 is a flow chart for explaining a process of a debug mode control in the other embodiment of the present invention.
Figure 10:
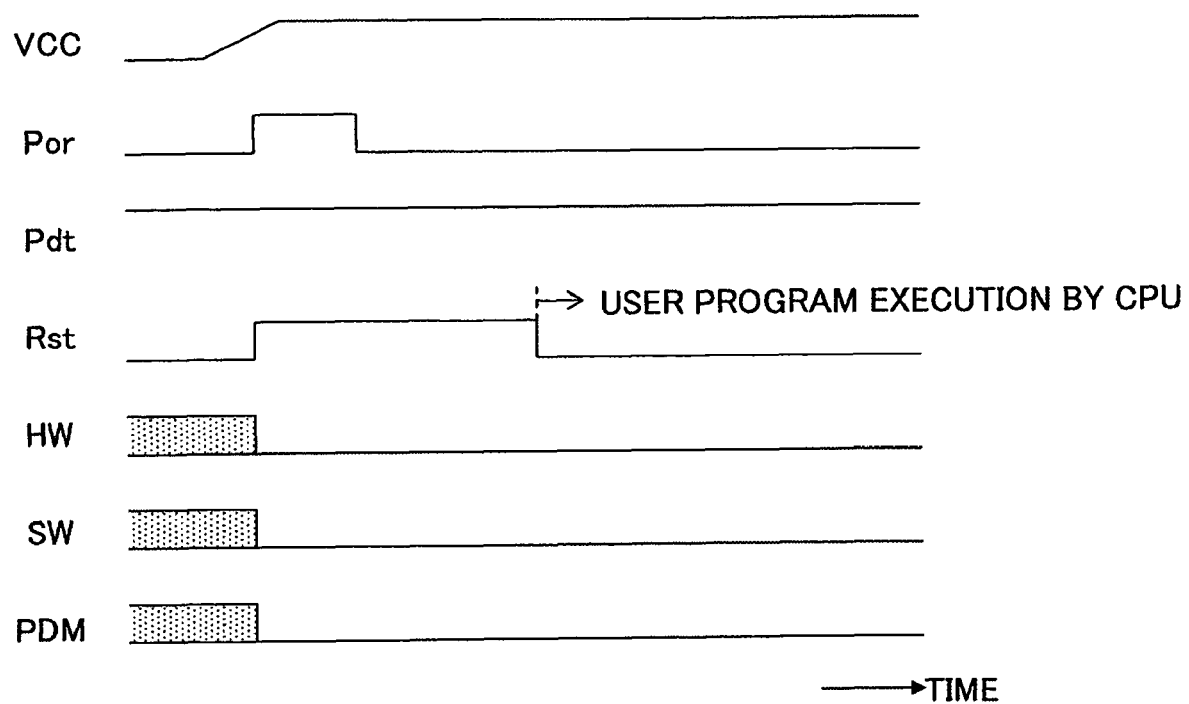
FIG. 10 is a time chart for explaining a case where a debug invalid mode is specified and a power-ON reset is generated in a normal manner.
Figure 11:
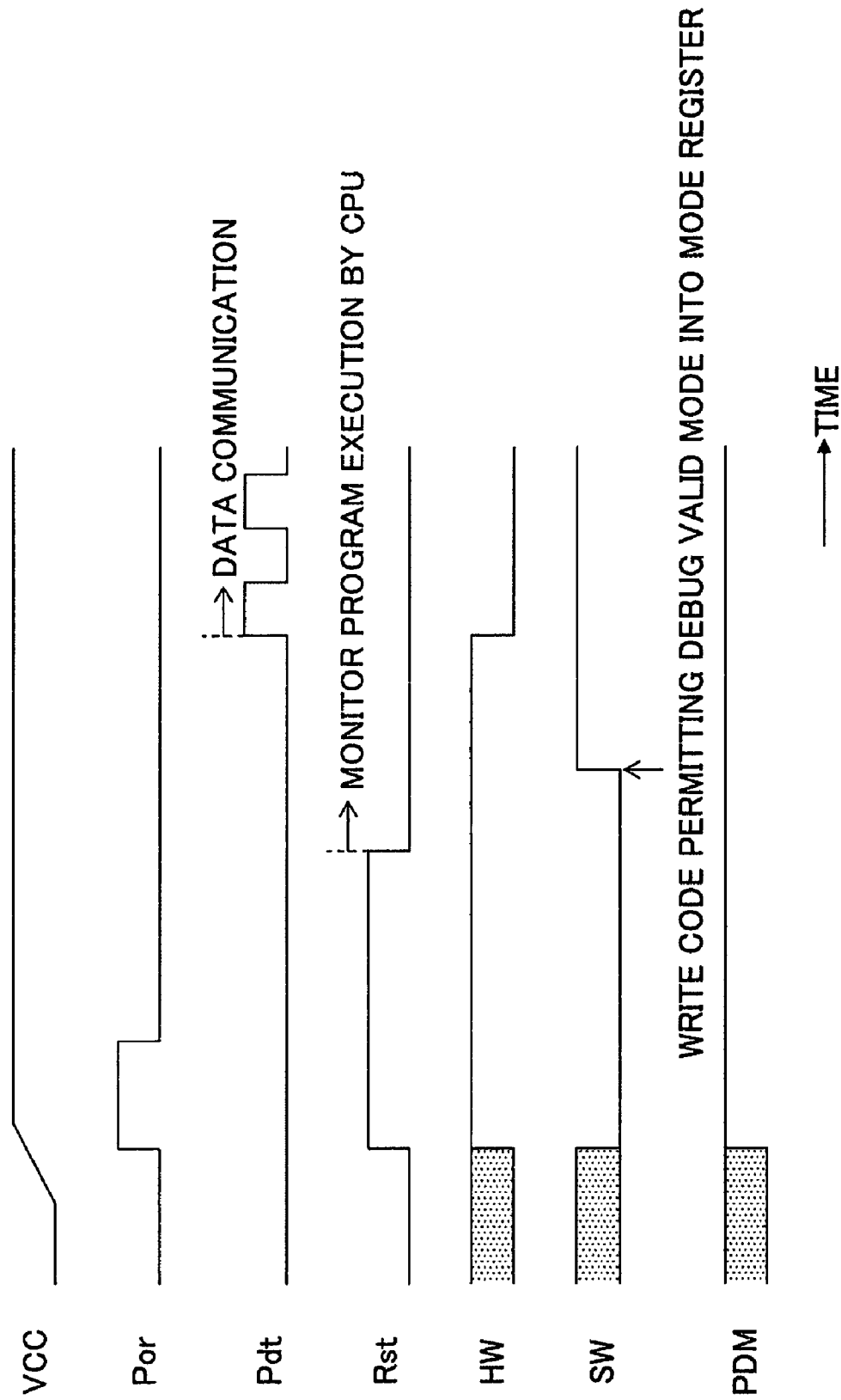
FIG. 11 is a time chart for explaining a case where a debug valid mode is specified and the power-ON reset is generated in a normal manner.
Figure 12:
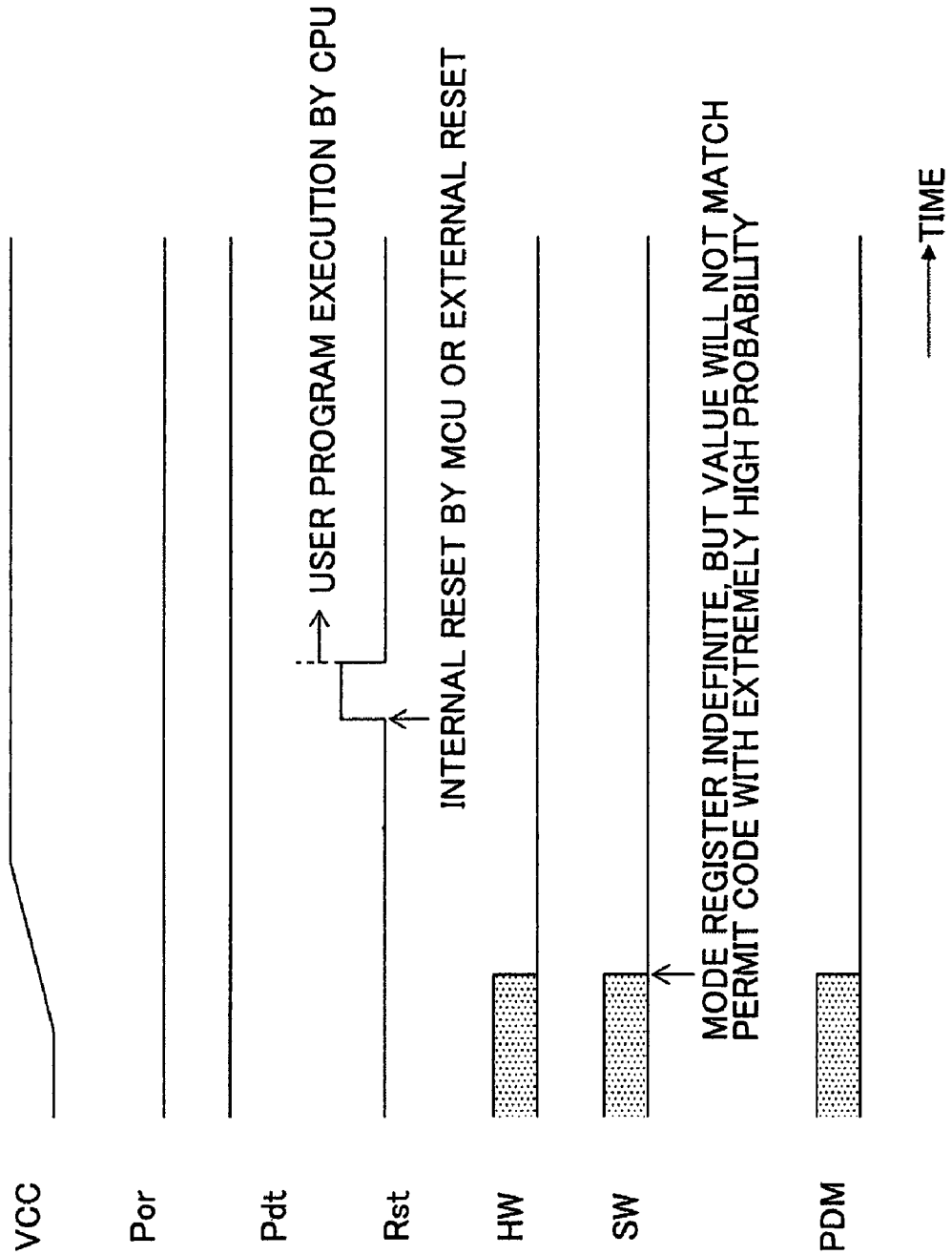
FIG. 12 is a time chart for explaining a case where the debug invalid mode is specified and the power-ON reset is not generated in a normal manner.
Figure 13:
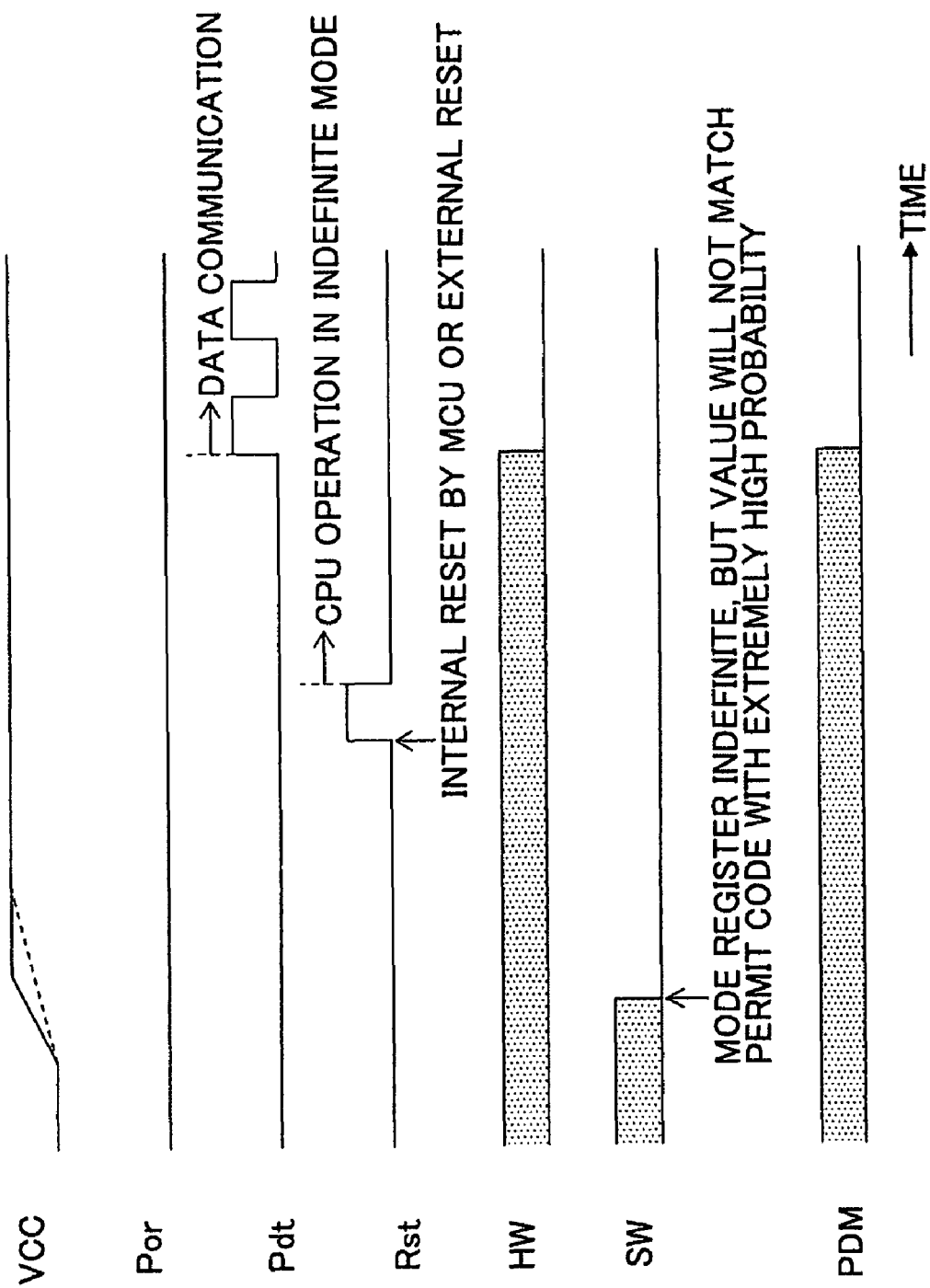
FIG. 13 is a time chart for explaining a case where the debug valid mode is specified and the power-ON reset is not generated in a normal manner.

A description will now be given of the debug mode control for the cases (1) through (4), by referring to FIGS. 9 through 13. FIG. 9 is a flow chart for explaining a process of the debug mode control in this other embodiment of the present invention. FIGS. 10 through 13 respectively are time charts showing timings of the debug mode control for the case where the debug circuit 12C shown in FIG. 8 is used as the debug circuit 12 shown in FIG. 1. FIG. 10 is a time chart for explaining a case where the debug invalid mode is specified and the power-ON reset is generated in a normal manner, and FIG. 11 is a time chart for explaining a case where the debug valid mode is specified and the power-ON reset is generated in a normal manner. FIG. 12 is a time chart for explaining a case where the debug invalid mode is specified and the power-ON reset is not generated in a normal manner, and FIG. 13 is a time chart for explaining a case where the debug valid mode is specified and the power-ON reset is not generated in a normal manner. In FIGS. 10 through 13, VCC denotes the power supply voltage, Por denotes the power-ON reset signal, Pdt denotes the debug signal, Rst denotes the reset signal of the MCU 1, HW denotes a signal output from the circuit part 131 and indicating the hardware mode, SW denotes a signal output from the circuit part 132 and indicating the software mode, and PDM denotes the debug mode signal.

In FIG. 9, the power of the MCU 1 is turned ON in a step S21, and a step S22 decides whether or not the external debug unit 2 is connected to the MCU 1. If the decision result in the step S22 is NO, a step S23 sets the input signal to the debug terminal 18 (that is, the debug signal Pdt) to a high level. A step S24 determines the mode to the debug invalid mode by the hardware mode, and a step S25 determines the mode to the debug invalid mode of the initial state by the software mode. A step S26 cancels the resetting of the MCU 1 by the reset signal Rst output from the reset control circuit 17. In a step S27, the CPU 11 executes the user program, and the process ends.

If the decision result in the step S22 is YES, a step S28 sets the input signal to the debug terminal 18 (that is, the debug signal Pdt) to a low level. A step S29 decides whether or not a power-ON reset by the power-ON reset signal Por is generated. If the decision result in the step S29 is NO, a step S30 judges that the debug mode is indefinite, and the process ends.

If the decision result in the step S29 is YES, a step S31 provisionally determines the mode to the debug valid mode by the hardware mode. A step S32 cancels the resetting of the MCU 1 by the reset signal Rst output from the reset control circuit 17. In a step S33, the CPU 11 executes the monitor program. A step S34 writes the specific code which permits the debug valid mode into the mode register 126. A step S35 definitely determines the mode to the debug valid mode by the software mode. A step S36 communicates with the external debug unit 2 via the debug terminal 18, and the process ends.

In the case (1) where the debug invalid mode is specified and the power-ON reset is generated in the normal manner, the specifying of the debug invalid mode is made by not connecting the external debug unit 2 to the MCU 1. When the external debug unit 2 is not connected to the MCU 1 and the power of the MCU 1 is turned ON, the input signal to the debug terminal 18 (that is, the debug signal Pdt) assumes a high level due to the pull-up resistor 19 connected to the debug terminal 18. Hence, the output of the SR latch forming the data latch circuit 124 assumes a low level, and the mode is determined to the debug invalid mode by the hardware mode. Because the mode register 126 is initialized by the power-ON reset and all bits of the mode register 126 are set to the low level, the value of the mode register 126 will not match the specific code 0xAA55 which permits the debug valid mode, and the mode is determined to the debug invalid mode by the software mode. As a result, the debug mode signal PDM, which is a logical sum of the hardware mode and the software mode, indicates the debug invalid mode.

When the resetting of the MCU 1 by the reset signal Rst output from the reset control circuit 17 is cancelled in the debug invalid mode, the CPU 11 executes the user program. In the debug invalid mode, the CPU 11 cannot make access to the mode register 126. Hence, in the debug invalid mode, the mode register 126 is constantly protected, and the debug invalid mode is always continued in the software mode. Because the debug invalid mode is continued in this manner in both the hardware mode and the software mode, the debug mode signal PDM which is the logical sum of the hardware mode and the software mode also continues the debug invalid mode as shown in FIG. 10.

In the case (2) where the debug valid mode is specified and the power-ON reset is generated in the normal manner, the debug valid mode is specified by connecting the external debug unit 2 to the MCU 1. When the external debug unit 2 is connected to the MCU 1 and the power of the MCU 1 is turned ON, the external debug unit 2 inputs a low-level debug signal Pdt to the debug terminal 18 for a predetermined time. This predetermined time in which the low-level debug signal Pdt is input to the debug terminal 18 is set sufficiently longer than a time it takes from the time when the power of the MCU 1 is turned ON until the resetting of the MCU 1 by the reset signal Rst output from the reset control circuit 17 is cancelled and the CPU 11 starts to operate. When the power of the MCU 1 is turned ON, the power-ON reset is generated in the normal manner and the power-ON reset signal Por is output. Hence, when the low-level debug signal Pdt is input to the debug terminal 18, the output of the SR latch forming the data latch circuit 124 assumes a high level due to the combination of these signals Por and Pdt, and the mode is determined to the debug valid mode by the hardware mode. At the same time, the debug mode signal PDM, which is the logical sum of the hardware mode and the software mode, indicates the debug valid mode.

When the resetting of the MCU 1 is cancelled by the reset signal Rst output from the reset control circuit 17 in the debug valid mode, the CPU 11 executes the monitor program for realizing the debug function, which is stored in the storage device 13 within the MCU 1. The monitor program writes the specific code 0xAA55 which permits the debug valid mode into the mode register 126 by a start process thereof. As a result, the mode is determined to the debug valid mode by the software mode.

The debug mode signal PDM is the logical sum of the output signal HW of the circuit part 131 indicating the hardware mode and the output signal SW of the circuit part 132 indicating the software mode. By the communication which starts after the external debug unit 2 inputs the low-level debug signal Pdt to the debug terminal 18 for the predetermined time, the debug valid mode determined by the hardware mode may become cancelled. However, the debug valid mode determined by the software mode continues unless the value of the mode register 126 is rewritten. Accordingly, the debug mode signal PDM continues the debug valid mode as shown in FIG. 11 due to the effects of the software mode.

In the case (2), because the debug mode signal PDM is the logical sum of the output signal HW of the circuit part 131 indicating the hardware mode and the output signal SW of the circuit part 132 indicating the software mode, the mode is determined to the debug valid mode from the time when the power-ON reset is generated. In other words, the hardware mode is a mechanism which provisionally determines the mode to the debug valid mode while the low-level debug signal Pdt is input to the debug terminal 18, and the software mode is a mechanism which definitely determines the mode to the debug valid mode using the fact that the mode is determined to the debug valid mode by the hardware mode as a trigger. For this reason, the debug valid mode may be cancelled by the communication in the hardware mode, but the debug valid mode is continued in the software mode so that, as a whole, the debug valid mode can be continued.

In the case (3) where the debug invalid mode is specified and the power-ON reset is not generated in the normal manner, the debug invalid mode is specified by not connecting the external debug unit 2 to the MCU 1. When the external debug unit 2 is not connected to the MCU 1 and the power of the MCU 1 is turned ON, the input signal (debug signal Pdt) at the debug terminal 18 assumes a high level due to the pull-up resistor 19 connected to the debug terminal 18. Hence, the output of the SR latch forming the data latch circuit 124 assumes a low level, and the mode is determined to the debug invalid mode by the hardware mode. The mode register 126 is not initialized because the power-ON reset is not generated in the normal manner. However, the probability of the value of the mode register 126 matching the specific code 0xAA55 which permits the debug valid mode is extremely low, and the mode is determined to the debug invalid mode by the software mode. As a result, the debug mode signal PDM, which is the logical sum of the output signal HW of the circuit part 131 indicating the hardware mode and the output signal SW of the circuit part 132 indicating the software mode, indicates the debug invalid mode as shown in FIG. 12.

The mode register 126 is constantly protected in the debug invalid mode, similarly to the case (1) described above, and thus, the debug mode signal PDM also similarly continues the debug invalid mode.

In the case (4) where the debug valid mode is specified and the power-ON reset is not generated in the normal manner, the debug valid mode is specified by connecting the external debug unit 2 to the MCU 1. When the external debug unit 2 is connected to the MCU 1 and the power of the MCU 1 is turned ON, the external debug unit 2 inputs a low-level debug signal Pdt to the debug terminal 18 for a predetermined time. When the power of the MCU 1 is turned ON and the power-ON reset is not generated in the normal manner, both the set conditions and the reset conditions of the SR latch forming the data latch circuit 124 do not occur, and the output of the SR latch becomes indefinite. In other words, the hardware mode becomes indefinite. After the external debug unit 2 inputs the low-level debug signal Pdt to the debut terminal 18 for the predetermined time, the input signal at the debug terminal 18 assumes a high level due to the effects of the pull-up resistor 19 connected to the debug terminal 18. In this state, the reset conditions of the SR latch occur, and the output of the SR latch becomes definite for the first time, and the hardware mode becomes definite. The mode is determined to the debug invalid mode by the hardware mode which becomes definite.

In the case (4), the mode register 126 is not initialized because the power-ON reset is not generated in the normal manner. However, because the probability of the value of the mode register 126 matching the specific code 0xAA55 which permits the debug valid mode is extremely low, the mode is determined to the debug invalid mode by the software mode.

The debug mode signal PDM is the logical sum of the output signal HW of the circuit part 131 indicating the hardware mode and the output signal SW of the circuit part 132 indicating the software mode. In the case (4), because the debug mode signal PDM becomes indefinite after the power of the MCU 1 is turned ON, there is a possibility, although low, that the MCU 1 will make an unpredictable operation as shown in FIG. 13.

Figure 4:
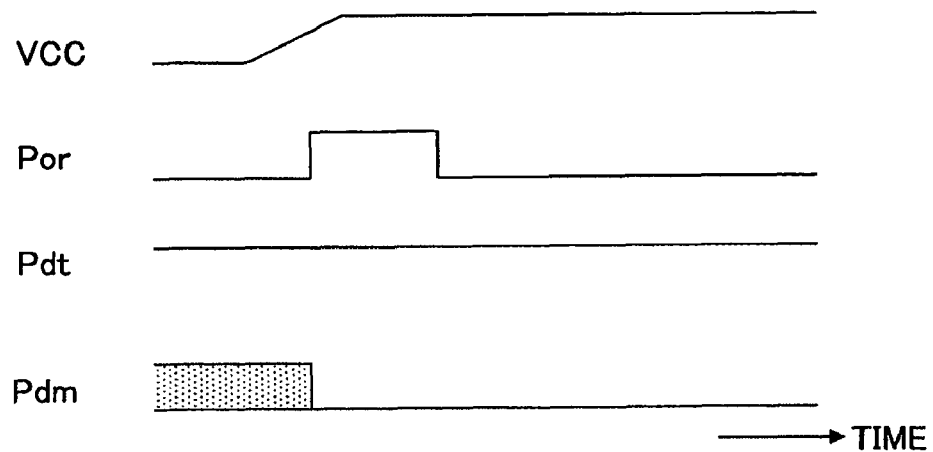
FIG. 4 is a time chart for explaining a case where a debug invalid mode is specified.
Figure 5:
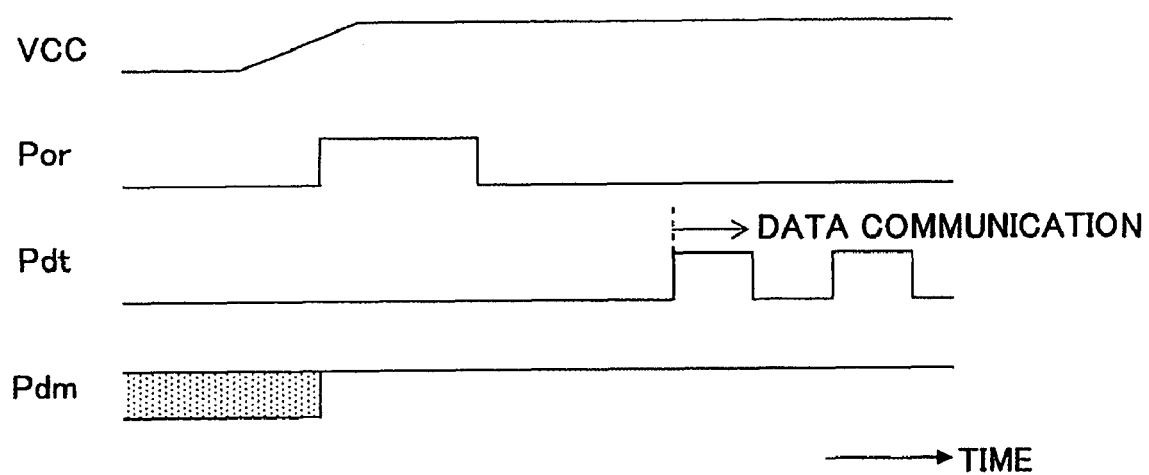
FIG. 5 is a time chart for explaining a case where a debug valid mode is specified.
Figure 6:
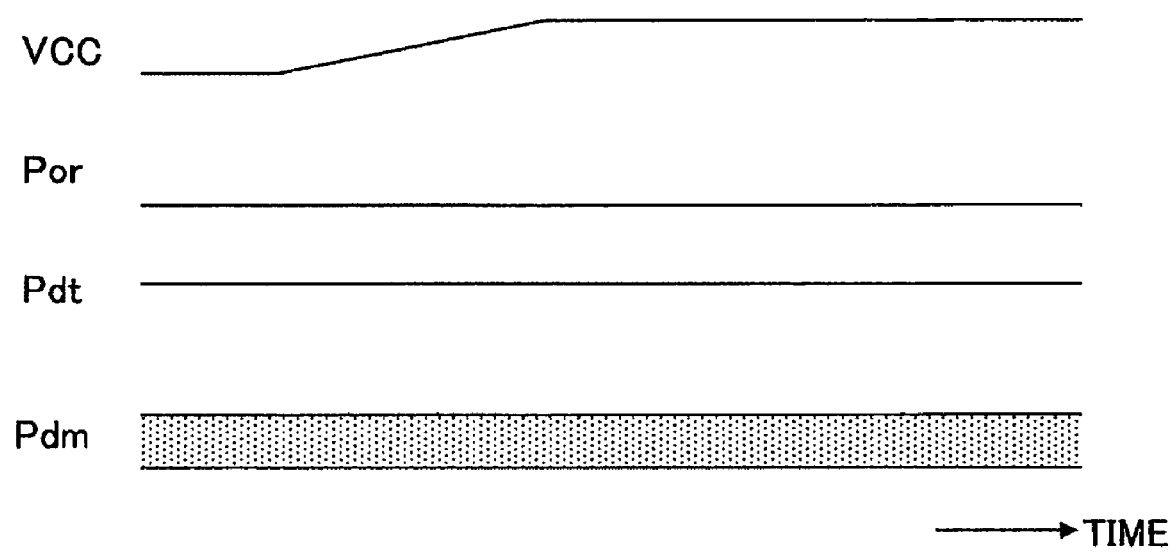
FIG. 6 is a time chart for explaining a case where a power-ON reset is not generated in a normal manner.

As described above, according to the debug mode control in FIG. 8, in the situation where the power-ON reset is generated in the normal manner, as in the cases (1) and (2) described above, it is possible to carry out a mode control which is similar to the conventional mode control described above in conjunction with FIGS. 4 and 5. In addition, in the situation where no power-ON reset is generated, the conventional problem described in conjunction with FIG. 6 wherein the mode may be determined to the debug valid mode when the debug invalid mode is specified is solved in the case (3) described above.

In the debug mode control shown in FIG. 8, it is not possible to avoid the inconvenience that occurs in the case (4) described above. However, in the case where the external debug unit 2 is connected to the MCU 1 and the debug valid mode is specified, the apparatus which includes the MCU 1 is not in operation, and instead, the MCU 1 and the apparatus which includes the MCU 1 are being debugged (or evaluated). For this reason, even if the power-ON reset is not generated in the normal manner, the person who is carrying out the debugging (or evaluation) can carry out an operation such as turning ON the power of the MCU 1 again, in order to restore the MCU 1 and the apparatus which includes the MCU 1. Accordingly, such a case does not introduce serious problems when compared to the case where the debug invalid mode is specified but the mode is determined to the debug valid mode contrary to the intended mode.

Figure 14:
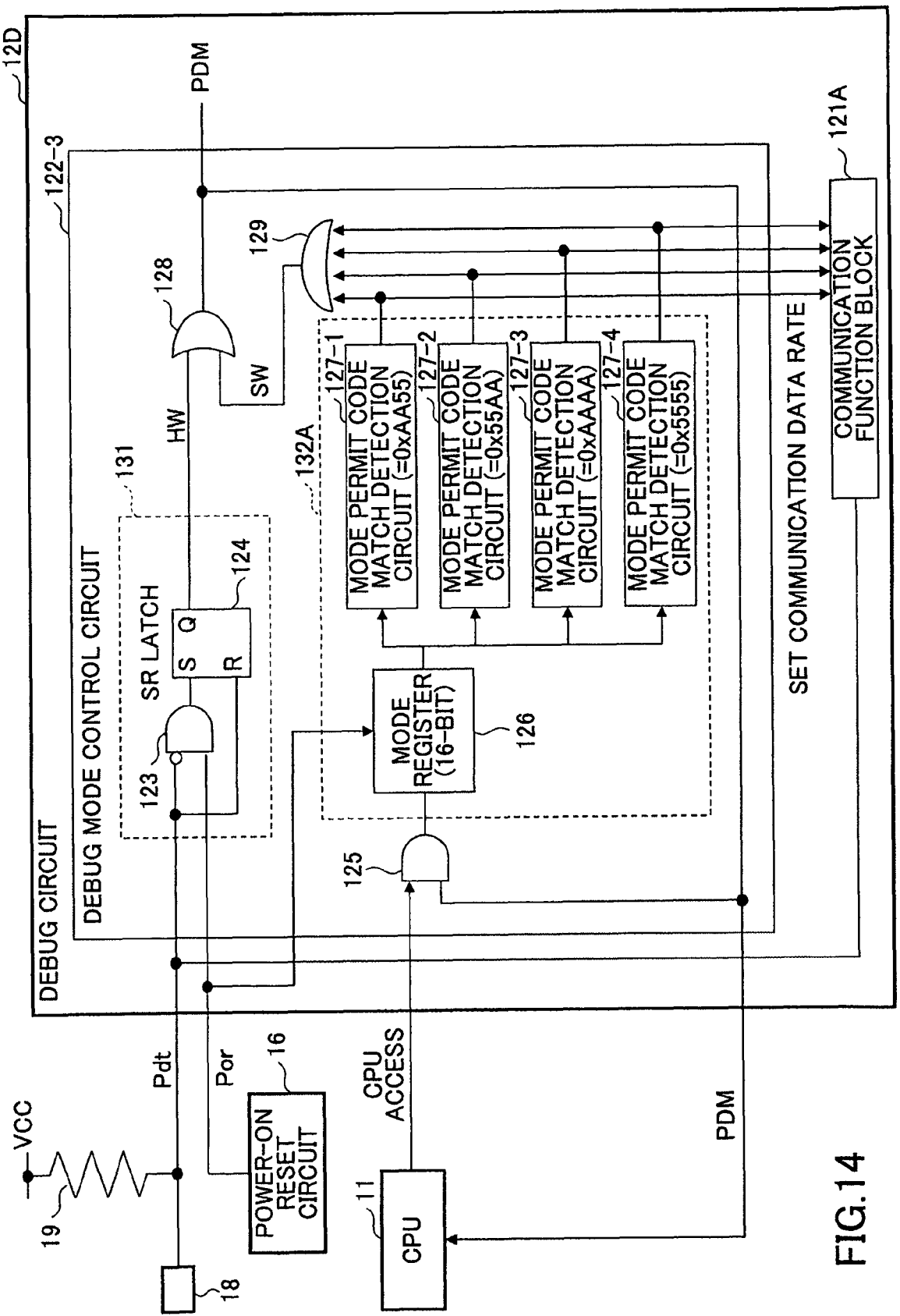
FIG. 14 is a circuit diagram showing a debug circuit in a further embodiment of the present invention.
Figure 15:
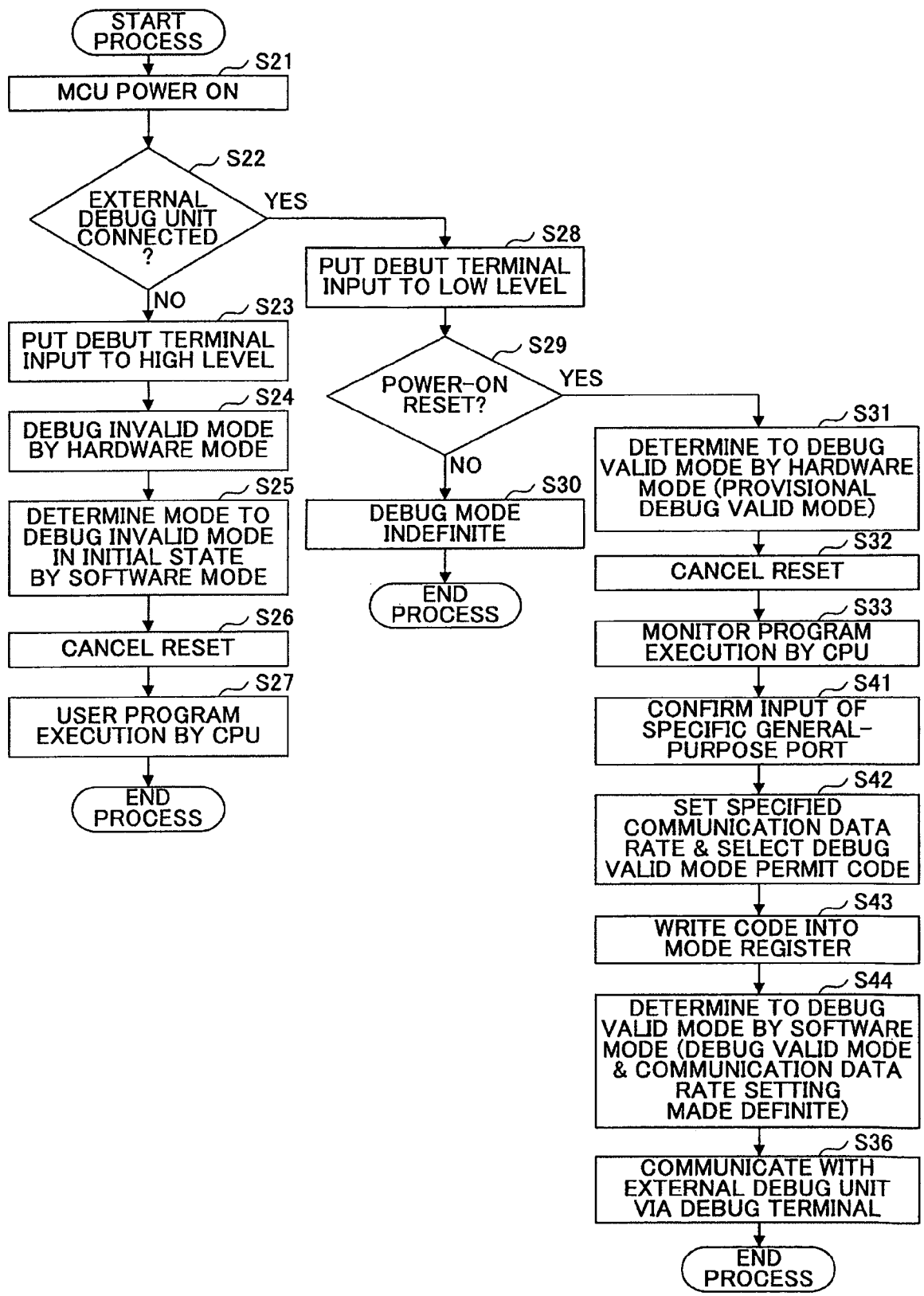
FIG. 15 is a flow chart for explaining a process of a debug mode control in the further embodiment of the present invention.

Next, a description will be given of a further embodiment of the present invention, by referring to FIGS. 14 and 15. FIG. 14 is a circuit diagram showing a debug circuit in a further embodiment of the present invention, and FIG. 15 is a flow chart for explaining a process of a debug mode control in this further embodiment of the present invention.

In FIG. 14, those parts that are the same as those corresponding parts in FIG. 8 are designated by the same reference numerals, and a description thereof will be omitted. A debug circuit 12D shown in FIG. 14 includes a debug mode control circuit 122-3. The debug mode control circuit 122-3 has an AND circuit 125, OR circuits 128 and 129, and circuit parts 131 and 132A which are connected as shown in FIG. 14. The circuit part 132A includes a mode register 126 and mode permit code match detection circuits 127-1 through 127-4. Outputs of the mode permit code match detection circuits 127-1 through 127-4 are supplied to the OR circuit 128 via the OR circuit 129 on one hand, and are directly supplied to a communication function block 121A on the other.

In the case shown in FIG. 8, the mode register 126 stores the specific code 0xAA55 in order to determine the mode to the debug valid mode by the software mode. However, the specific code 0xAA55 is merely one example of the code which may be used, and other codes in which the high levels and the low levels respectively are 50% may be used as the specific code. In other words, codes other than 0xAA55, such as 0xAAAA and 0x5555, may be used for the specific code.

On the other hand, the mode register 126 is formed by a multi-bit register, and is a 16-bit register in the above described case. But from the point of view of the utilization efficiency of the register bits, it may not be ideal to use the mode register 126 for only a single mode. Hence, in the case shown in FIG. 14, the modes and the settings used in the debug valid mode are realized by the mode register 126 in order to improve the utilization efficiency of the register bits.

More particularly, the specific code is extended (or expanded), and sub modes are provided with respect to the debug valid mode which is a main mode, in order to prescribe the operation (that is, to prescribe the data rate for the communication in this example). For example, the specific code permits the debug valid mode by four codes 0xAA55, 0x55AA, 0xAAAA and 0x5555. In addition, each of these four codes 0xAA55, 0x55AA, 0xAAAA and 0x5555 are made to correspond to mutually different sub modes within the debug valid mode.

In the debug mode control, the debug terminal 18 is used as a terminal for communication after the debug valid mode is determined. In one example, the sub modes are allocated to the settings of the data rate for the communication. In other words, in the case (2) described above where the external debug unit 2 is connected to the MCU 1 and is operated in the debug valid mode, a specific port of the general-purpose ports of the MCU 1 which are provided as peripheral functions is connected to the apparatus (or board) on which the MCU 1 is provided by subjecting the specific port to a pull-up process or a pull-down process, and the data rate for the communication is set to the MCU 1 via the specific port. The monitor program which is executed by the CPU 11 in the debug valid mode reads by the start process thereof an input value of a specific general-purpose port of the CPU 11, detects the data rate for the communication set via the general-purpose port, and determines the specific code to be written into the mode register 126. The determined specific code is written into the mode register 126. For example, by allocating the specific code in the following manner, it is possible to set the data rate for the communication so as to correspond to a frequency-divided value of a source oscillation clock input to the MCU 1.

0xAA55: Debug valid mode, with the data rate for the communication set to ¼ the source oscillation frequency (or a value obtained by frequency-dividing the source oscillation frequency by 4).

0x55AA: Debug valid mode, with the data rate for the communication set to ⅛ the source oscillation frequency (or a value obtained by frequency-dividing the source oscillation frequency by 8).

0xAAAA: Debug valid mode, with the data rate for the communication set to ¹⁄₁₆ the source oscillation frequency (or a value obtained by frequency-dividing the source oscillation frequency by 16).

0x5555: Debug valid mode, with the data rate for the communication set to ¹⁄₃₂ the source oscillation frequency (or a value obtained by frequency-dividing the source oscillation frequency by 32).

The sub modes indicated by the four codes which are detected by the mode permit code match detection circuits 127-1 through 127-4 are supplied to the communication function block 121A. Hence, in this example, the set data rate for the communication (or the communication data rate that is set) is supplied to the communication function block 121A.

In FIG. 15, those steps that are essentially the same as those corresponding steps in FIG. 9 are designated by the same reference numerals, and a description thereof will be omitted. In FIG. 15, if the decision result in the step S29 is YES, the steps S31 through S33 are executed, and a step S41 confirms the input of the specific general-purpose port of the CPU 11. A step S42 selects the debug valid mode permit code which sets the communication data rate that is to be specified. A step S43 writes the selected debug valid mode permit code into the mode register 126. A step S44 definitely determines the mode to the debug valid mode by the software mode, and definitely sets the communication data rate. The step S36 communicates with the external debug unit 2 via the debug terminal 18, and the process ends.

In the example described above, the setting of the communication data rate (that is, the four settings) is integrated into the functions of the mode register 126. If the four settings were realized by register bits other than the register bits of the mode register 126, two separate register bits would be required. But by integrating the four settings into the functions of the mode register 126, the two separate register bits can be omitted, and the debug circuit 12D can be formed by a smaller number of register bits.

This application claims the benefit of a Japanese Patent Application No. 2007-271657 filed Oct. 18, 2007, in the Japanese Patent Office, the disclosure of which is hereby incorporated by reference.

Further, the present invention is not limited to these embodiments, but various variations and modifications may be made without departing from the scope of the present invention.

What is claimed is:

1. A semiconductor integrated circuit comprising:
   a terminal configured to input a debug signal which specifies a debug mode;
   a reset circuit configured to generate a reset signal when a power is turned ON; and
   a debug mode control circuit configured to output a control signal which causes a shift to the debug mode based on the debug signal and the reset signal,
   said debug mode control circuit comprising:
      a latch circuit configured to generate a first signal by latching the debug signal; and
      a register circuit configured to generate a second signal when written with a permit code,
   wherein the control signal is generated based on the first signal and the second signal.

2. The semiconductor integrated circuit as claimed in claim 1, wherein the first signal and the second signal both become invalid and the debug mode control circuit does not output the control signal, if no debug signal is input to the terminal and the reset signal is generated from the reset circuit when the power is turned ON.

3. The semiconductor integrated circuit as claimed in claim 1, wherein the first signal becomes valid and the debug mode control circuit outputs the control signal due to the permit code being written into the register circuit, if the debug signal is input to the terminal and the reset signal is generated from the reset circuit when the power is turned ON.

4. The semiconductor integrated circuit as claimed in claim 1, wherein the first signal and the second signal both become invalid and the debug mode control circuit does not output the control signal, if no debug signal is input to the terminal and the reset circuit generates no reset signal when the power is turned ON.

5. The semiconductor integrated circuit as claimed in claim 1, wherein the second signal becomes invalid and the debug mode control signal does not output the control signal, if the debug signal is input to the terminal and the reset circuit generates no reset signal when the power is turned ON.

6. The semiconductor integrated circuit as claimed in claim 1, wherein the latch circuit latches a signal level of the debug signal which is input to the terminal during a time when the reset signal for resetting the semiconductor integrated circuit is generated.

7. The semiconductor integrated circuit as claimed in claim 1, further comprising:
   a CPU configured to execute a user program after a resetting of the semiconductor integrated circuit is cancelled in a debug invalid mode, and to execute a program dedicated to debugging after the resetting of the semiconductor integrated circuit is cancelled in a debug valid mode, after the debug mode is determined.

8. The semiconductor integrated circuit as claimed in claim 1, wherein the terminal is made up of a single terminal.

9. A debug mode determination method comprising:
   a mode of a first stage determined by an input signal level of a mode terminal when a power-ON reset is generated; and
   a mode of a second stage determined by writing a code which permits a debug mode into an accessible mode register when the mode of the first stage is a specific mode,
   wherein the debug mode is controlled by the mode of the first stage and the mode of the second stage.

10. The debug mode determination method as claimed in claim 9, wherein the specific mode is continued in the second stage until the code which permits the mode written in the mode register is rewritten into a code which prohibits the mode.

11. The debug mode determination method as claimed in claim 9, further comprising:
   providing a plurality of codes permitting the mode written into the mode register in the second stage; and continuing the specific mode for all of the plurality of codes, and setting sub modes which prescribe an operation in the debug mode by each of the plurality of codes.

12. The debug mode determination method as claimed in claim 11, wherein each of the sub modes prescribes a data rate for communication via the terminal.

13. The debug mode determination method as claimed in claim 9, wherein the mode terminal is made up of a single terminal.

* * * * *